United States Patent
Sirard et al.

(10) Patent No.: US 12,119,218 B2
(45) Date of Patent: Oct. 15, 2024

(54) SACRIFICIAL PROTECTION LAYER FOR ENVIRONMENTALLY SENSITIVE SURFACES OF SUBSTRATES

(71) Applicant: Lam Research Corporation, Fremont, CA (US)

(72) Inventors: Stephen M. Sirard, Austin, TX (US); Ratchana Limary, Austin, TX (US); Yang Pan, Los Altos, CA (US); Diane Hymes, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 17/310,303

(22) PCT Filed: Jan. 28, 2020

(86) PCT No.: PCT/US2020/015451
§ 371 (c)(1),
(2) Date: Jul. 27, 2021

(87) PCT Pub. No.: WO2020/160016
PCT Pub. Date: Aug. 6, 2020

(65) Prior Publication Data
US 2024/0030023 A1  Jan. 25, 2024

Related U.S. Application Data

(60) Provisional application No. 62/798,015, filed on Jan. 29, 2019.

(51) Int. Cl.
*H01L 21/02* (2006.01)
*H01L 21/306* (2006.01)
*H01L 21/67* (2006.01)

(52) U.S. Cl.
CPC .. *H01L 21/02118* (2013.01); *H01L 21/02282* (2013.01); *H01L 21/02307* (2013.01);
(Continued)

(58) Field of Classification Search
None
See application file for complete search history.

(56) References Cited

U.S. PATENT DOCUMENTS 4,753,830 A  6/1988 Matsuda et al.
5,441,695 A  8/1995 Gladden
(Continued)

FOREIGN PATENT DOCUMENTS

CN  1531745  9/2004
CN  101828249 A  9/2010
(Continued)

OTHER PUBLICATIONS

International Search Report and Written Opinion dated May 27, 2020 issued in Application No. PCT/US2020/015451.
(Continued)

*Primary Examiner* — Michael Lebentritt
(74) *Attorney, Agent, or Firm* — Weaver Austin Villeneuve & Sampson LLP

(57) ABSTRACT

A method for protecting a surface of a substrate during processing includes a) providing a solution forming a co-polymer having a ceiling temperature; b) dispensing the solution onto a surface of the substrate to form a sacrificial protective layer, wherein the co-polymer is kinetically trapped to allow storage at a temperature above the ceiling temperature; c) exposing the substrate to ambient conditions for a predetermined period; and d) de-polymerizing the sacrificial protective layer by using stimuli selected from a group consisting of ultraviolet (UV) light and heat.

20 Claims, 7 Drawing Sheets

(52) U.S. Cl.
CPC .. *H01L 21/02348* (2013.01); *H01L 21/30625* (2013.01); *H01L 21/6715* (2013.01)

(56) References Cited

U.S. PATENT DOCUMENTS

| | | | |
|---|---|---|---|
| 5,571,447 | A | 11/1996 | Ward et al. |
| 5,731,229 | A | 3/1998 | Kato et al. |
| 6,337,277 | B1 | 1/2002 | Chou et al. |
| 6,573,201 | B1 | 6/2003 | Ogure et al. |
| 7,011,716 | B2 | 3/2006 | Xu et al. |
| 8,318,866 | B2 | 11/2012 | Kurz et al. |
| 9,466,511 | B2 | 10/2016 | Sirard et al. |
| 10,662,274 | B2 | 5/2020 | Kohl et al. |
| 11,104,790 | B1 | 8/2021 | Lomazoff et al. |
| 11,862,473 | B2 | 1/2024 | Sirard et al. |
| 2003/0224586 | A1 | 12/2003 | Sabnis |
| 2004/0040653 | A1 | 3/2004 | Nuzzo et al. |
| 2004/0087176 | A1 | 5/2004 | Colburn et al. |
| 2004/0146803 | A1 | 7/2004 | Kohl et al. |
| 2005/0106493 | A1 | 5/2005 | Ho et al. |
| 2006/0089003 | A1 | 4/2006 | Cheng et al. |
| 2006/0257758 | A1 | 11/2006 | Daley et al. |
| 2008/0004203 | A1 | 1/2008 | Scheuing et al. |
| 2009/0130863 | A1 | 5/2009 | Toma et al. |
| 2009/0142931 | A1 | 6/2009 | Wang et al. |
| 2009/0286188 | A1 | 11/2009 | Hatakeyama et al. |
| 2010/0003781 | A1* | 1/2010 | Van Duren ............. H01L 31/18 438/98 |
| 2010/0255303 | A1 | 10/2010 | Wardle et al. |
| 2011/0189858 | A1 | 8/2011 | Yasseri et al. |
| 2013/0008868 | A1 | 1/2013 | Uozumi et al. |
| 2014/0242623 | A1 | 8/2014 | Phillips et al. |
| 2014/0253137 | A1 | 9/2014 | Chuang et al. |
| 2014/0373384 | A1 | 12/2014 | Sirard et al. |
| 2015/0024256 | A1* | 1/2015 | Anandan ............... H01M 6/187 429/162 |
| 2015/0221500 | A1 | 8/2015 | Ogihara et al. |
| 2015/0228533 | A1 | 8/2015 | Hwang et al. |
| 2016/0086829 | A1 | 3/2016 | Sirard et al. |
| 2017/0098541 | A1 | 4/2017 | Gouk et al. |
| 2017/0273192 | A1 | 9/2017 | Sato et al. |
| 2017/0345683 | A1 | 11/2017 | Sasaki et al. |
| 2018/0155483 | A1 | 6/2018 | Kohl et al. |
| 2018/0204770 | A1 | 7/2018 | Varaprasad et al. |
| 2018/0308695 | A1 | 10/2018 | LaVoie et al. |
| 2018/0315725 | A1 | 11/2018 | Lin et al. |
| 2018/0335697 | A1 | 11/2018 | Wang et al. |
| 2019/0015878 | A1 | 1/2019 | Kawaguchi et al. |
| 2019/0088470 | A1 | 3/2019 | Varaprasad et al. |
| 2019/0385903 | A1 | 12/2019 | Kikuchi et al. |
| 2020/0013613 | A1 | 1/2020 | Blanquart |
| 2020/0040282 | A1 | 2/2020 | Aoki et al. |
| 2022/0301859 | A1 | 9/2022 | Blachut et al. |
| 2022/0328338 | A1 | 10/2022 | Blachut et al. |
| 2023/0178364 | A1 | 6/2023 | Blachut et al. |
| 2023/0207305 | A1 | 6/2023 | Sirard et al. |
| 2023/0295412 | A1 | 9/2023 | Sirard et al. |

FOREIGN PATENT DOCUMENTS

| | | |
|---|---|---|
| CN | 1027419 | 10/2012 |
| EP | 3366639 A1 | 8/2018 |
| JP | S5351963 A | 5/1978 |
| JP | H05341536 A | 12/1993 |
| JP | H0776741 A | 3/1995 |
| JP | H07245332 A | 9/1995 |
| JP | 9-275085 | 10/1997 |
| JP | 1999-021496 A | 1/1999 |
| JP | 2005070535 A * | 3/2005 |
| JP | 2005109390 A | 4/2005 |
| JP | 2005183751 A | 7/2005 |
| JP | 2005251901 A | 9/2005 |
| JP | 2006504853 A | 2/2006 |
| JP | 2007157768 A | 6/2007 |
| JP | 2012049446 A | 3/2012 |
| JP | 2013016699 A | 1/2013 |
| JP | 2013021208 A | 1/2013 |
| JP | 2015-092619 A | 5/2015 |
| JP | 2015-106645 A | 6/2015 |
| JP | 2016-032063 A | 3/2016 |
| JP | 2017-152600 A | 8/2017 |
| JP | 2020187368 A | 11/2020 |
| KR | 20010004411 A | 1/2001 |
| KR | 2009-0006551 A | 1/2009 |
| KR | 20160033624 A | 3/2016 |
| KR | 101827020 B1 | 3/2018 |
| TW | 200813212 A | 3/2008 |
| WO | WO-2014161036 A1 | 10/2014 |
| WO | WO-2020033015 A2 | 2/2020 |
| WO | WO-2020160016 A1 | 8/2020 |
| WO | WO-2020161879 A1 | 8/2020 |
| WO | WO-2021030252 A1 | 2/2021 |
| WO | WO-2021046572 A1 | 3/2021 |
| WO | WO-2021231307 A1 | 11/2021 |
| WO | WO-2022006349 A1 | 1/2022 |
| WO | WO-2022026323 A1 | 2/2022 |

OTHER PUBLICATIONS

International Preliminary Report on Patentability dated Aug. 12, 2021 issued in Application No. PCT/US2020/015451.
International Search Report and Written Opinion dated Dec. 18, 2020 issued in Application No. PCT/US2020/070483.
International Search Report and Written Opinion dated Dec. 15, 2020 issued in Application No. PCT/US2020/048955.
Taiwanese First Office Action dated Dec. 11, 2020 issued in Application No. TW 109112730.
Office Action issued in U.S. Appl. No. 14/489,615 on Mar. 8, 2016.
Notice of Allowance issued in U.S. Appl. No. 14/489,615 on Jun. 8, 2016.
Chinese First Search dated Nov. 15, 2017 issued in Application No. CN 2015105932346.
Chinese First Office Action dated Nov. 27, 2017 issued in Application No. CN 2015105932346.
Alojaly, H., et al., "Packaging With Plastics and Polymeric Materials," Reference Module in Materials Science and Materials Engineering, Elsevier, 2020, ISBN 9780128035818, pp. 1-17.
Bhadha P. M., "How Weld Hose Materials Affect Shielding Gas Quality," Welding Journal, 1999, pp. 35-40.
CN Office Action dated Dec. 15, 2023 in CN Application No. 202080011611.X with English translation.
CN Office Action dated Oct. 24, 2023, in Application No. CN202080062440.3 with English translation.
Feinberg, et al., "Cyclic Poly(phthalaldehyde): Thermoforming a Bulk Transient Material" ACS Macro Lett., 2018, vol. 7, pp. 47-52.
International Preliminary Report on Patentability dated Feb. 9, 2023 in PCT Application No. PCT/US2021/042978.
International Preliminary Report on Patentability dated Jan. 12, 2023, in PCT Application No. PCT/US2021/040009.
International Preliminary Report on Patentability dated Mar. 17, 2022 in PCT Application No. PCT/US2020/048955.
International Preliminary Report on Patentability dated Mar. 17, 2022 in PCT Application No. PCT/US2020/070483.
International Preliminary Report on Patentability dated Mar. 23, 2023 in Application No. PCT/US2021/049713.
International Preliminary Report on Patentability dated Nov. 24, 2022, in PCT Application No. PCT/U82021/031595.
International Preliminary Report on Patentability dated Nov. 24, 2022, in PCT Application No. PCT/US2021/031594.
International Search Report and Written Opinion dated Jan. 12, 2023 in PCT Application No. PCT/US2022/044750.
International Search Report and Written Opinion dated Jan. 22, 2024 in PCT Application No. PCT/US2023/034707.
International Search Report and Written Opinion dated Jan. 3, 2022 in Application No. PCT/US2021/049713.
International Search Report and Written Opinion dated Nov. 18, 2021, in PCT Application No. PCT/US2021/042978.
International Search Report and Written Opinion dated Oct. 26, 2021, in application No. PCT/US2021/040009.

(56) References Cited

OTHER PUBLICATIONS

International Search Report and Written Opinion mailed on Aug. 25, 2021, in Application No. PCT/US2021/031594.
International Search Report and Written Opinion mailed on Aug. 30, 2021, in PCT Application No. PCT/US2021/031595.
JP Office Action dated Feb. 6, 2024 in JP Application No. 2021-544131, with English Translation.
JP Office Action dated May 16, 2023 in Application No. JP2022-568696 with English translation.
Kaitz, J. A. et al., "End Group Characterization of Poly(Phthalaldehyde): Surprising Discovery of a Reversible, Cationic Macrocyclization Mechanism", Journal of the American Chemical Society, 2013, vol. 135, pp. 12755-12761.
KR Office Action dated Sep. 25, 2023, in Application No. KR10-2022-7043224 with English translation.
Schwartz, J. M. et al., "Stable, high-molecular-weight poly(phthalaldehyde)", Journal of polymer science, part A: polymer chemistry, 2016, vol. 55, pp. 1166-1172.
SG Office Action dated Oct. 10, 2023, in application No. SG11202202088Q.
SG Search Report and Written Opinion dated Dec. 16, 2022 in Application No. SG11202108294U.
SG Search Report and Written Opinion dated Jan. 16, 2024 in SG Application No. 11202202086R.
TW Decision of Refusal dated Sep. 14, 2021, in application No. TW109112730 with English translation.
TW Office Action dated Jan. 8, 2024 in TW Application No. 109102787 with English Translation.
TW Office Action dated Nov. 11, 2022, in Application No. TW109112730 with English Translation.
U.S. Non-Final Office Action dated Mar. 8, 2023 in U.S. Appl. No. 17/998,489.
U.S. Notice of Allowance dated Jul. 11, 2023 in U.S. Appl. No. 17/998,489.
U.S. Appl. No. 17/998,489, inventors Sirard et al., filed on Nov. 10, 2022.
Uzunlar, E. et al., "Decomposable and Template Polymers: Fundamentals and Applications", Journal of Electronic Packaging, Apr. 19, 2016, vol. 138, No. 2, pp. 1-15.
Uzunlar, E. et al., "Size-Compatible, Polymer-Based Air-Gap Formation Processes, and Polymer Residue Analysis for Wafer-Level MEMS Packaging Applications," Journal of Electronic Packaging, 2015, vol. 137(4), pp. 1-13.
Wood, J.D. et al., "Annealing Free, Clean Graphene Transfer Using Alternative Polymer Scaffolds", Nanotechnology, Jan. 12, 2015, vol. 26, No. 5, pp. 1-9.
Yadav, R K. et al., "In Situ Prepared Flexible 3D Polymer Film Photocatalyst for Highly Selective Solar Fuel Production from $CO_2$," ChemCatChem, 2018, vol. 10(9), pp. 2024-2029.
SG Written Opinion dated Apr. 19, 2024 in SG Application No. 11202108294U.
International Preliminary Report on Patentability and Written Opinion dated Apr. 11, 2024 in PCT Application No. PCT/US2022/044750.
KR Office Action dated Apr. 29, 2022, in Application No. KR10-2015-0131204 with English translation.
TW Office Action dated Jun. 7, 2024 in TW Application No. 109130167 with English translation.
JP Office Action dated Jul. 23, 2024 in JP Application No. 2021-544131 with English translation.
CN Office Action dated Jun. 12, 2024 in CN Application No. 202080062440.3, with English Translation.
U.S. Non-Final Office Action dated Aug. 27, 2024 in U.S. Appl. No. 17/639,850.
U.S. Restriction Requirement dated Jul. 16, 2024 in U.S. Appl. No. 17/639,869.

* cited by examiner

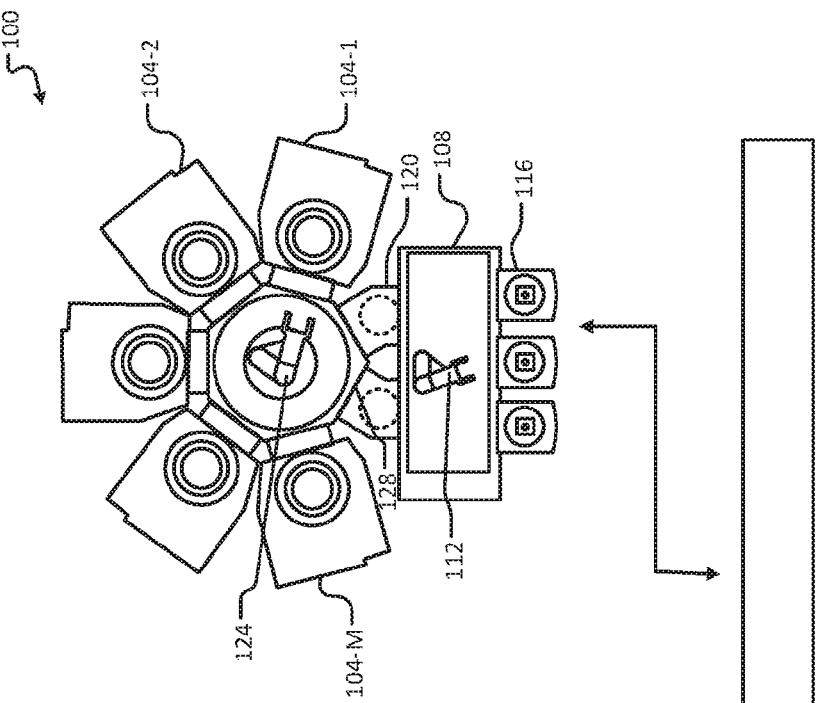
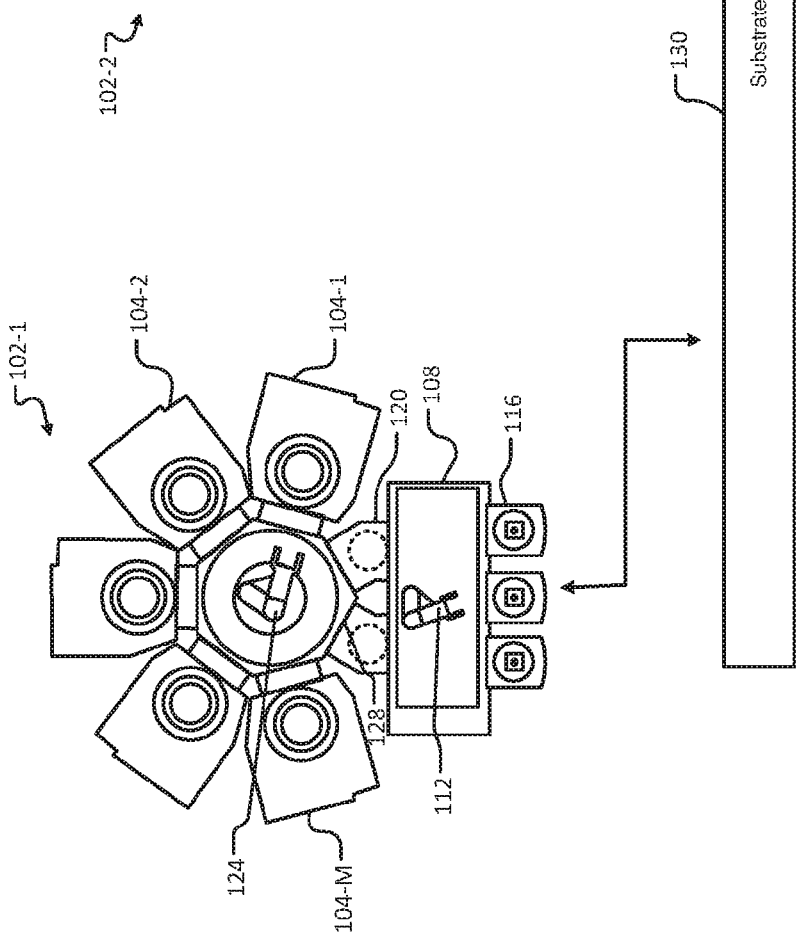
FIG. 1

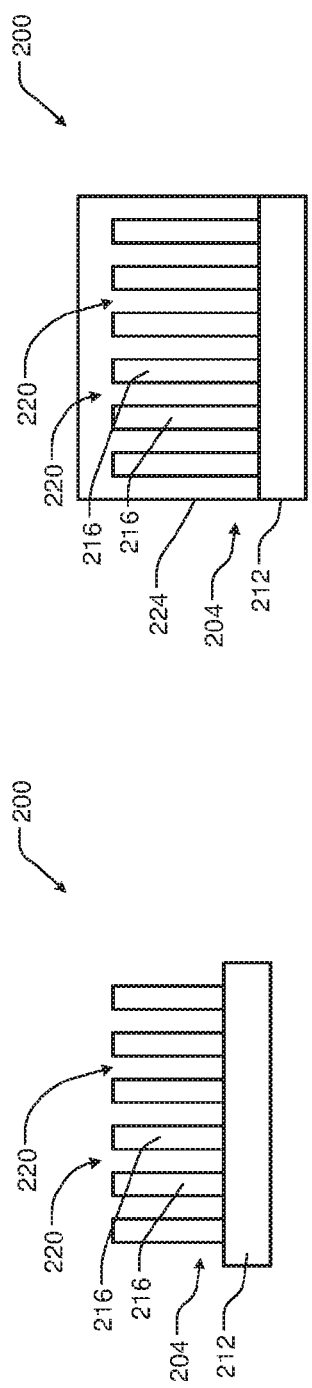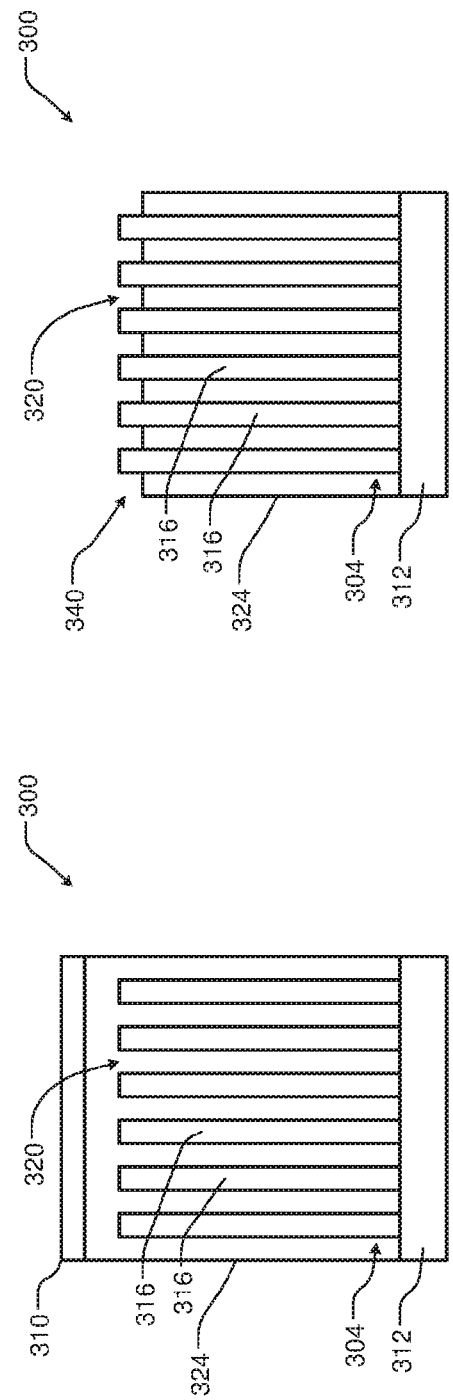

SACRIFICIAL PROTECTION LAYER FOR ENVIRONMENTALLY SENSITIVE SURFACES OF SUBSTRATES

INCORPORATION BY REFERENCE

A PCT Request Form is filed concurrently with this specification as part of the present application. Each application that the present application claims benefit of or priority to as identified in the concurrently filed PCT Request Form is incorporated by reference herein in its entirety and for all purposes.

FIELD

The present disclosure relates to substrate processing, and more particularly to systems and methods for adding and removing sacrificial protective layers to environmentally sensitive surfaces of substrates.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Semiconductor processing systems may be used to perform treatments on substrates such as semiconductor wafers. During processing, the substrates are transported to and from different substrate processing tools for different treatments. During transfer and/or storage, surfaces of the substrates may be exposed to contaminants, ambient air, light, moisture, etc. Exposure during transfer and/or storage may cause defects, material modifications, and/or otherwise adversely impact a downstream process.

SUMMARY

A method for protecting a surface of a substrate during processing includes a) providing a solution forming a co-polymer having a ceiling temperature; b) dispensing the solution onto a surface of the substrate to form a sacrificial protective layer, wherein the co-polymer is kinetically trapped to allow storage at a temperature above the ceiling temperature; c) exposing the substrate to ambient conditions for a predetermined period; and d) de-polymerizing the sacrificial protective layer by using stimuli selected from a group consisting of ultraviolet (UV) light and heat.

In other features, the co-polymer comprises a poly(aldehyde) co-polymer. The ceiling temperature is lower than room temperature. The method includes dispensing a casting solvent on the substrate prior to dispensing the solution on the substrate. The method includes adding a thermal catalyst to the solution prior to dispensing the solution. The thermal catalyst is selected from a group consisting of a thermal acid generator and a thermal base generator.

In other features, the method includes adding a photocatalyst to the solution prior to dispensing the solution. The photocatalyst is selected from a group consisting of a photo acid generator and a photo base generator. The method includes adding a dye to the photocatalyst.

In other features, d) includes d1) dispensing a thermal catalyst onto the sacrificial protective layer; and d2) heating the substrate to a temperature that is greater than a catalyzed co-polymer degradation temperature and less than an un-catalyzed co-polymer temperature.

In other features, the method includes repeating d1) and d2) one or more times until the sacrificial protective layer is removed.

In other features, the method includes d3) heating the substrate to a temperature that is greater than the un-catalyzed co-polymer temperature to remove remaining portions of the sacrificial protective layer.

In other features, the thermal catalyst is selected from a group consisting of a thermal acid generator and a thermal base generator.

In other features, prior to b), performing a first treatment process on the substrate in a first substrate processing tool; performing a) and b) in the first substrate processing tool; performing d) in a second substrate processing tool; and performing a second treatment process on the substrate in the second substrate processing tool.

In other features, the first treatment process is selected from a group consisting of deposition, etching, stripping, cleaning, chemical mechanical planarization (CMP), patterning, or modification of electrical properties of the substrate. The second treatment process is selected from a group consisting of deposition, etching, stripping, cleaning, chemical mechanical planarization (CMP), patterning, or modification of electrical properties of the substrate.

A method for protecting a surface of a substrate during processing includes a) providing a solution forming a co-polymer having a ceiling temperature; b) dispensing the solution onto a surface of the substrate to form a sacrificial protective layer, wherein the co-polymer is kinetically trapped to allow storage at a temperature above the ceiling temperature; c) exposing the substrate to ambient conditions for a predetermined period; and d) de-polymerizing the sacrificial protective layer by exposing the substrate to an acidic vapor.

In other features, the ceiling temperature is lower than room temperature. The method includes dispensing a casting solvent on the substrate prior to dispensing the solution on the substrate. In other features, the method includes, prior to b), performing a first treatment process on the substrate in a first substrate processing tool; performing a) and b) in the first substrate processing tool; performing d) in a second substrate processing tool; and performing a second treatment process on the substrate in the second substrate processing tool.

In other features, the first treatment process is selected from a group consisting of deposition, etching, stripping, cleaning, chemical mechanical planarization (CMP), patterning, or modification of electrical properties of the substrate. The second treatment process is selected from a group consisting of deposition, etching, stripping, cleaning, chemical mechanical planarization (CMP), patterning, or modification of electrical properties of the substrate.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 1 is a functional block diagram of an example of a substrate processing system including multiple substrate processing tools and a storage buffer according to the present disclosure;

FIG. 2A is a side cross-sectional view of an example of a substrate according to the present disclosure;

FIG. 2B is a side cross-sectional view of an example of a substrate including a sacrificial protective layer according to the present disclosure;

FIG. 3A is a side cross-sectional view of an example of a substrate including a sacrificial protective layer and a first catalyst layer according to the present disclosure;

FIG. 3B is a side cross-sectional view of an example of a substrate including the sacrificial protective layer that is partially removed according to the present disclosure;

In the drawings, reference numbers may be reused to identify similar and/or identical elements.

DETAILED DESCRIPTION

Figure 3C:
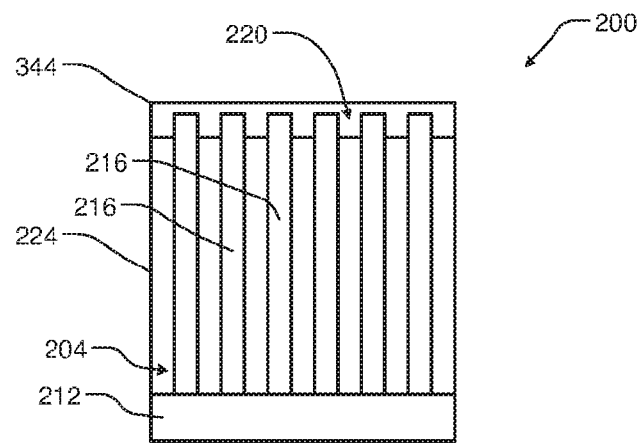
FIG. 3C is a side cross-sectional view of an example of a substrate including the sacrificial protective layer and a second catalyst layer according to the present disclosure.

Substrate surfaces may be exposed to ambient conditions during semiconductor fabrication. Many of the substrate surfaces are sensitive to modification due to ambient or environmental exposure. The surface changes that occur can adversely impact a subsequent process and/or degrade device performance. This exposure phenomena may be referred to herein as queue time effects.

In order to manage queue time effects, integrated substrate processing tools have been developed to allow processing to take place in a highly controlled environment with little or no exposure to ambient conditions. This approach usually requires substantial design changes to the substrate processing tools. In addition, there are substantial logistical problems when the integrated substrate processing tool is taken offline for repair.

Another solution for mitigating queue time effects is to control the environment during transfer. For example, front opening unified pods (FOUPS) may be modified to provide a controlled atmosphere during transfers of the substrates between the substrate processing tools. For example, the FOUP may provide a molecular nitrogen atmosphere. However, there are still risks associated with outgassing, leaks, and/or wafer transport that may contaminate the surfaces of the substrates.

Polymers have been used as barriers in several industries including food packaging and pharmaceuticals. The polymer film is applied and then later removed. The polymer film can be used to protect the surfaces of the substrates from environmental threats. At some point, however, the polymer film needs to be removed. Common removal processes include both dry plasma and/or wet clean processes. However, the removal processes tend to be aggressive and usually modify the surfaces of the substrates.

Polymers that are stable at room temperature (e.g. 20-25° C.) have been used in sacrificial polymer applications. For example, poly(carbonates) can be used. However, there are some disadvantages with using these types of polymers. During the removal process, relatively high temperatures are needed (i.e. 160° C. to 300° C.) to assist in chemical bond-breaking because the polymers are stable at room temperature. The removal process is slow because each chemical unit needs to be activated.

In addition, these types of polymers include inadvertent, non-carbonate bonds (e.g. ether linkages) which, when decomposed, create non-volatile residues. Thus, these polymers have limited usefulness in applications where monolayer impurities cannot be tolerated. Pure poly(carbonates) are not currently available.

Systems and methods according to the present disclosure apply a sacrificial protection layer on a substrate including a low ceiling temperature ($T_c$) co-polymer. $T_c$ is the equilibrium temperature between the co-polymer and its monomers. As used herein, the term low $T_c$ refers $T_c$ values below room temperature. In other words, the co-polymers are thermodynamically unstable at room temperature. Instead, the low $T_c$ co-polymer is kinetically trapped to allow prolonged storage at room temperature. In some examples, the stable storage period is on the order of months or years. Low $T_c$ co-polymers will rapidly de-polymerize to its monomer constituents if an end-group or main chain bond is broken. Thus, the co-polymer de-polymerizes in response to stimuli such as ultraviolet (UV) light, heat, or an acidic/basic catalyst.

The sacrificial protection layer provides protection for the exposed surfaces of the substrates during integrated circuit (IC) fabrication and/or after processing. For example, the sacrificial protection layer protects sensitive thin film for extended periods when the substrate is exposed to ambient conditions by acting as a diffusion barrier to ambient contaminants and by blocking reactive surface sites.

The sacrificial protection layer is removed at relatively low temperature without requiring the use of plasma or wet processing (which cause surface modification). The heat, UV light, and/or acidic/basic catalysts trigger spontaneous de-polymerization and vaporization of the sacrificial protection layer. This type of removal process minimizes the impact on the sensitive surfaces of the substrate. Examples of substrate surfaces that can be sensitive to environmental queue time effects include silicon, silicon germanium, and germanium structures such as fins and nanowires, tungsten contacts, and/or other structures and materials.

As described above, the low $T_c$ co-polymers are thermodynamically unstable at room temperature. Below $T_c$, the material is a co-polymer. Above $T_c$, the material includes two or more volatile monomers. Low $T_c$ co-polymers can be kinetically trapped at temperatures well above $T_c$ with excellent shelf-life. Stability is achieved by kinetically inhibiting the mechanism of de-polymerization.

In some examples, the low $T_c$ co-polymers include poly (aldehydes). For example, poly(phthalaldehyde) (PPHA) ($T_c$=−40° C.) is stable at room temperature for 2.5 years. Additional examples of low $T_c$ co-polymers are described in U.S. Patent Application Publication Serial No. 2018/

0155483, which was published on Jun. 7, 2018 and which is hereby incorporated herein by reference in its entirety.

Systems and methods described herein apply a sacrificial protective layer including the low $T_c$ co-polymer onto environmentally sensitive surfaces of substrates such as semiconductor wafers. The sacrificial protective layer provides a barrier against atmospheric contaminants such as oxygen and water. In another example, the sacrificial protective layer provides a barrier against halogens such as fluorine which can outgas from FOUP carriers. As a result, the surfaces of the substrates have extended queue time stability by slowing the permeation (sorption and diffusion) of undesired contaminants to the surface. Furthermore, the sacrificial protective layer can block reactive sites on the surface.

The low-T a co-polymers described herein can be readily removed at moderate temperatures (<150° C.) by exposure to heat, UV light, acidic/basic catalysts, and/or acidic vapors. In some examples, the catalyst includes a photocatalyst or a thermal catalyst. In some examples, the photocatalyst includes a photo acid generator (PAG) or a photo base generator. In some examples, the thermal catalyst includes thermal acid generator (TAG) or a thermal base generator. Some of the co-polymers described herein are sensitive to acids or bases. Release of acids or bases cause de-polymerization into volatile monomers. The catalysts cause the sacrificial protective layer to de-polymerize into volatile monomers in response to UV light and/or heat. In some examples, the solution forming the co-polymer is mixed with the photocatalysts or thermal catalysts when they are cast. In some examples, a dye may be added to the solution before casting to control photon penetration depth and hence degradation depth when the PAG catalyst is used.

In other examples, the TAG or PAG catalyst is added as an additional layer above an un-catalyzed co-polymer layer prior to the removal of the sacrificial co-polymer layer. When the TAG catalyst is used, the un-catalyzed co-polymer has a higher degradation temperature than the catalyzed co-polymer. Therefore, partial degradation can be performed to prevent collapse of HAR structures. The temperature of the substrate is increased above the degradation temperature of the catalyzed co-polymer but below the degradation temperature of the un-catalyzed co-polymer.

As will be described further below, the volume of the catalyst that is applied may be used to control the vertical thickness of the un-catalyzed co-polymer that is removed in a step. In some examples, when applying the TAG or PAG catalyst to remove the uncatalyzed copolymer in successive steps, the degraded monomer is removed faster than the diffusion/reaction of the catalyst.

Low $T_c$ co-polymers have several advantages when used for the sacrificial protection layer. The low $T_c$ co-polymers such as poly(aldehydes) are simple to synthesize and only poly(aldehydes) are formed with no unwanted side products. Therefore, residue-free vaporization of the low $T_c$ co-polymer can be achieved.

Since poly(aldehydes) are depolymerized at temperatures well above $T_c$, only one (or few) chemical bonds need to be broken to overcome the kinetic stabilization and initiate full, rapid de-polymerization. Since all of the bonds are the same (no inadvertent impurities), little or no residue remains after removal. The sacrificial protection layers eliminate the need for the integrated substrate processing tool platforms or the specialized FOUP environments.

In some examples, the sacrificial protective layer is applied in a substrate processing tool after processing and prior to exposure to ambient conditions during transfer or storage. In some examples, the substrates may be exposed to ambient conditions during transfer to and/or storage in a storage buffer or other location. In other examples, the substrates may be exposed to ambient conditions during transfer from one substrate processing chamber or tool to another substrate processing chamber or tool.

After storage and/or transfer and prior to additional substrate processing, the sacrificial protective layer is removed. In some examples, removal of the sacrificial protective layer is performed in a substrate processing tool and then other processes are performed on the substrate in the same substrate processing tool without exposure to ambient conditions. In some examples, a single substrate has the sacrificial protection layer applied and removed a plurality of times during substrate processing.

Referring now to FIG. 1, a substrate processing system 100 includes one or more substrate processing tools 102 (substrate processing tools 102-1 and 102-2 are shown for illustration purposes) and substrate buffer 130 or other substrate storage. Each of the substrate processing tools 102-1 and 102-2 includes a plurality of processing chambers 104-1, 104-2, . . . and 104-M (collectively processing chambers 104) (where M is an integer greater than one). For example only, each of the processing chambers 104 may be configured to perform a substrate treatment. In some examples, the substrates may be loaded into one of the processing chambers 104, processed, and then moved to one or more other ones of the processing chambers 104 and/or removed from the substrate processing tool 100 (e.g., if all perform the same treatment).

Substrates to be processed are loaded into the substrate processing tools 102-1 and 102-2 via ports of a loading station of an atmosphere-to-vacuum (ATV) transfer module 108. In some examples, the ATV transfer module 108 includes an equipment front end module (EFEM). The substrates are then transferred into one or more of the processing chambers 104. For example, a transfer robot 112 is arranged to transfer substrates from loading stations 116 to load locks 120. A vacuum transfer robot 124 of a vacuum transfer module 128 is arranged to transfer substrates from the load locks 120 to the various processing chambers 104.

After processing in one or more of the substrate processing tools 102-1 and 102-2, the substrates may be transported outside of a vacuum environment. For example, the substrates may be moved to a location for storage (such as the substrate buffer 130). In other examples, the substrates may be moved directly from the substrate processing tool to another substrate processing tool for further processing or from the storage buffer 130 to another substrate processing tool for further processing.

As was previously described above, exposure of the substrate to ambient conditions may cause defects or otherwise adversely impact downstream processing. Systems and methods according to the present disclosure are used to add the sacrificial protective layer to the substrate prior to exposure to ambient conditions. In some examples, the sacrificial protective layer is applied in the substrate processing tool prior to transferring the substrate to the substrate buffer for storage or to another substrate processing tool. In other examples, the sacrificial protective layer is applied in another processing chamber (not associated with the substrate processing tool).

Prior to performing another treatment on the substrate, the sacrificial protective layer is removed. For example, the substrate may be transferred to the substrate processing tool 102-2 after a period of storage in the storage buffer 130 or after processing in the substrate processing tool 102-1. The sacrificial protective layer may be removed by one of the processing chambers in the substrate processing tool 102-2 or another processing chamber (not associated with the substrate processing tool 102-2).

In some examples, the sacrificial protective layer is applied by a processing chamber in the same substrate processing tool (that performed substrate treatment) prior to exposure to ambient conditions. Since the substrate processing tool operates at vacuum, exposure of the substrate to ambient conditions is prevented.

In some examples, the sacrificial layer is deposited after a wet clean process. In this case, oxides and residues may be removed by the wet clean process and the sacrificial layer is deposited in sequence prior to drying the wafer. In some examples, this process is not done under vacuum and is done without any exposure of the dry pristine surface to the ambient.

In other examples, the substrate is transported from the substrate processing tool to another processing chamber located outside of the substrate processing tool that adds the sacrificial protective layer. Using this approach limits or reduces the period of exposure of the substrate to ambient conditions. Exposure is limited to a brief period of transport from the substrate processing tool to the processing chamber where the sacrificial protective layer is applied. Storage of the substrate may be performed for longer periods without additional exposure to ambient conditions.

Subsequently, the sacrificial protective layer may be removed prior to further processing. In some examples, the sacrificial protective layer is removed in another substrate processing tool under vacuum conditions prior to substrate treatment in processing chambers of the same substrate processing tool. In other examples, the substrate is transported to a processing chamber that removes the sacrificial protective layer and then to the substrate processing tool for further processing. This approach also limits exposure to ambient conditions between the processing chamber and the substrate processing tool or other environment.

Referring now to FIGS. 2A and 2B, a sacrificial protective layer can be added to a substrate to prevent or reduce the effect of exposure of the substrate to ambient conditions. In FIG. 2A, a substrate 200 is shown. The substrate includes a layer 204 arranged on one or more underlying layers 212. In some examples, the layer 204 includes features such as pillars 216 and trenches 220. In other examples, the layer 204 can be planar and/or can have other types of features. As can be appreciated, a single material or two or more different types of materials or films may be exposed. In FIG. 2B, a sacrificial protective layer 224 is deposited on the substrate 200 and covers the layer 204.

After the sacrificial protective layer 224 is added, the substrate 200 can be transported and/or stored in ambient conditions for extended periods with a significant reduction in or elimination of contamination. The sacrificial protective layer 224 is removed by applying heat, UV light, exposing the substrate to acidic vapor and/or using a catalyst, as will be described further below.

Figure 3D:
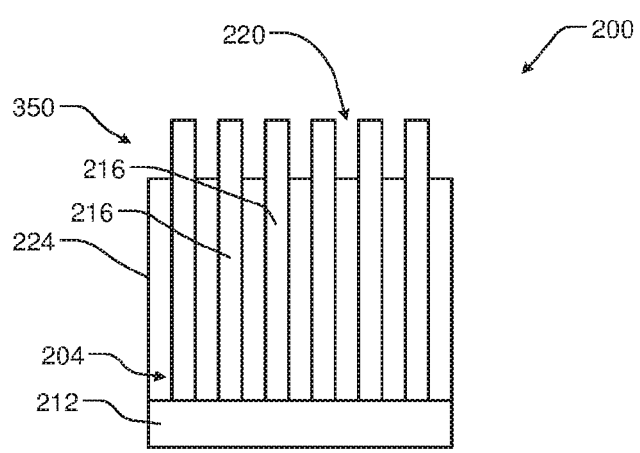
FIG. 3D is a side cross-sectional view of an example of a substrate including the sacrificial protective layer that is further removed according to the present disclosure.

Referring now to FIGS. 3A and 3D, the sacrificial protective layer can be removed in one step as shown in FIGS. 2A and 2B or removed in steps to prevent collapse of features. In FIG. 3A, a substrate 300 is shown to include a layer 304 arranged on one or more underlying layers 312. In some examples, the layer 304 includes high aspect ratio (HAR) features such as pillars 316 and trenches 320.

A sacrificial protective layer 324 (similar to FIG. 2B) is deposited on the substrate 300 and covers the layer 304. After the sacrificial protective layer 324 is added, the substrate 300 can be transported and/or stored in ambient conditions for extended periods with a significant reduction in or elimination of contamination.

When it is time to remove the sacrificial protective layer 324, a catalyst layer 310 is cast, sprayed, applied or deposited onto the sacrificial protective layer 324. The volume of catalyst solution that is used is determined by how much of the sacrificial protective layer 324 is to be removed. After depositing the catalyst layer 310, the substrate 300 is exposed to heat or UV light to activate the catalyst layer 310. The catalyst layer 310 locally lowers a temperature that is needed to remove a portion 340 of the sacrificial protective layer 324. The portion 340 of the sacrificial protective layer 224 is removed as shown in FIG. 3B.

The process of incrementally removing the sacrificial protective layer 324 may include additional cycles of depositing the catalyst layer and/or may be done with a single catalyst layer by controlling the top down diffusion of catalyst and removing other portions of the sacrificial protective layer 324. In FIG. 3C, a catalyst layer 344 is cast, sprayed, applied or deposited. In FIG. 3D, heat or UV light is applied and another portion 350 of the sacrificial protective layer 324 is removed. The process continues until all of the sacrificial protective layer 324 is removed. As can be appreciated, the process for incrementally removing the sacrificial protective layer in a controlled manner reduces or prevents damage (such as collapse) to the features that otherwise may occur with a single step removal process. Collapse may occur as the triggered degradation causes the sacrificial protective layer to temporarily transition to a liquid-like material that collapses HAR structures due to capillary force prior to evaporation of the monomers.

Figure 4:
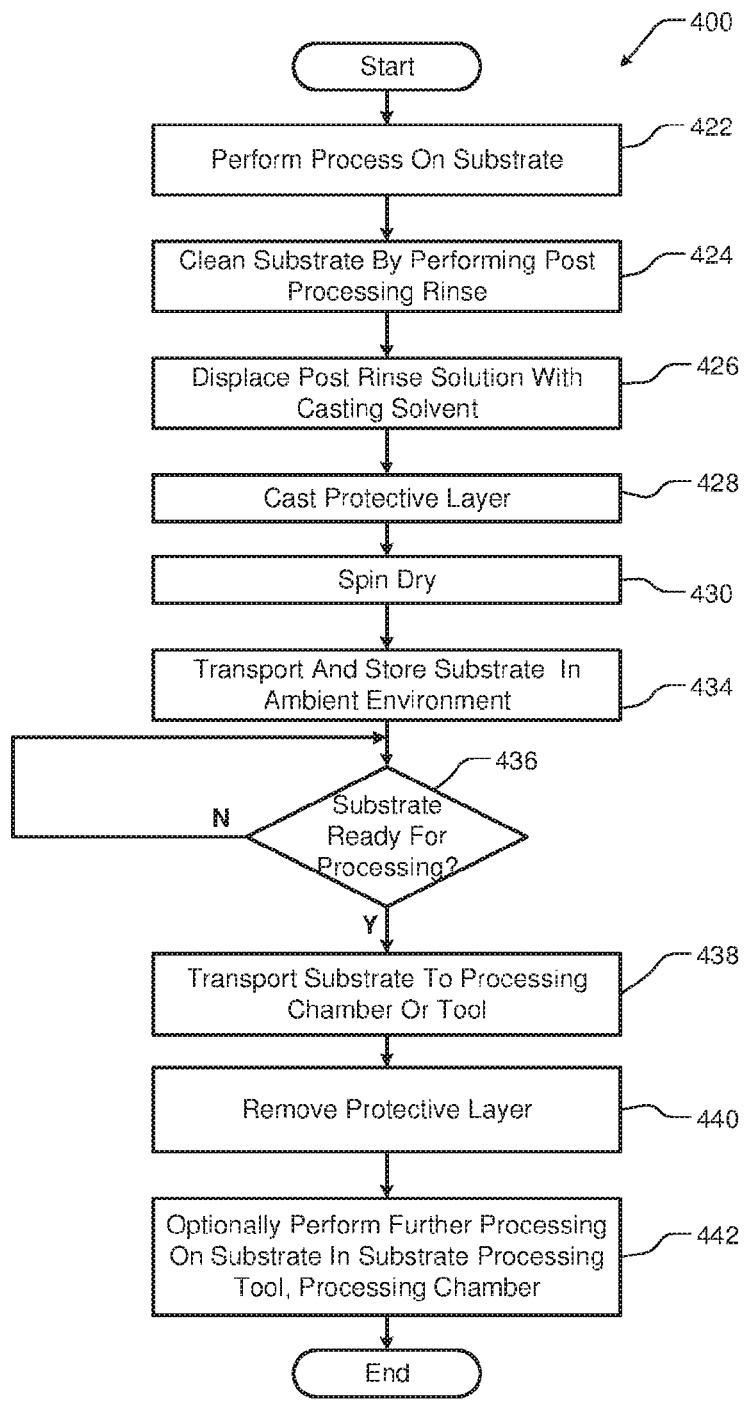
FIG. 4 is a flowchart of an example of a method for adding and removing a sacrificial protective layer from a substrate according to the present disclosure.

Referring now to FIG. 4, a method 400 for adding and removing the sacrificial protective layer from the substrate is shown. At 422, a process is performed on the substrate 200. In some examples, the process includes deposition, etching, stripping, cleaning, chemical mechanical planarization (CMP), patterning, modification of electrical properties (e.g. doping and optionally annealing or exposure to ultraviolet (UV) light to alter the dielectric constant) or another process. At 424, the substrate is cleaned by performing a post processing rinse with a post rinse solution. In some examples, dilute hydrofluoric (HF) acid or another solution is used to remove native oxide.

At 426, the post rinse solution is optionally displaced by a casting solvent. At 428, a solution that will form the sacrificial protective layer is cast, sprayed, applied or deposited on the substrate. In some examples, the solution includes the TAG catalyst. In some examples, the solution includes the PAG catalyst and/or the dye. At 430, the substrate is optionally rotated or spun to dry the substrate. At 434, the substrate is transported and/or stored in an ambient environment.

At 436, the method determines whether the sacrificial protective layer needs to be removed (e.g. when the substrate is ready for additional processing). If 436 is true, the substrate is transported to a processing chamber or substrate processing tool at 438. At 440, the sacrificial protective layer is removed.

In some examples, the sacrificial protective layer is removed using heat at a temperature in a predetermined temperature range from 50° C. to 300° C. In some examples, the sacrificial protective layer is removed using heat at a temperature in a predetermined temperature range from 50° C. to 150° C. In some examples, the sacrificial protective layer is removed using exposure to ultraviolet (UV) light. In some examples, the catalyst is added to the solution forming the co-polymer. In some examples, the dye is also added to the solution when the photocatalyst is added to control degradation of the co-polymer. In other examples, an un-catalyzed co-polymer is deposited and the catalyst is dispensed onto the substrate during removal of the sacrificial protection layer (see FIG.

In some examples, the sacrificial protective layer is removed by exposure to an acidic vapor species. In some examples, the acidic vapor includes hydrogen bromide (HBr) or other acidic vapor. In some examples, when HBr vapor is used, the temperature of the substrate is maintained at a pressure in a range from 5 mT to 5000 mT) and a temperature in a range from 0° C. to 100° C. In some examples, the temperature of the substrate is maintained at a pressure in a range from 750 mT to 1500 mT) and a temperature in a range from 35° C. to 70° C. In some examples, the temperature of the substrate is maintained at a pressure of 1000 mT and a temperature of 60° C. At 442, further processing of the substrate may be performed in a substrate processing tool, processing chamber or other location.

Figure 5:
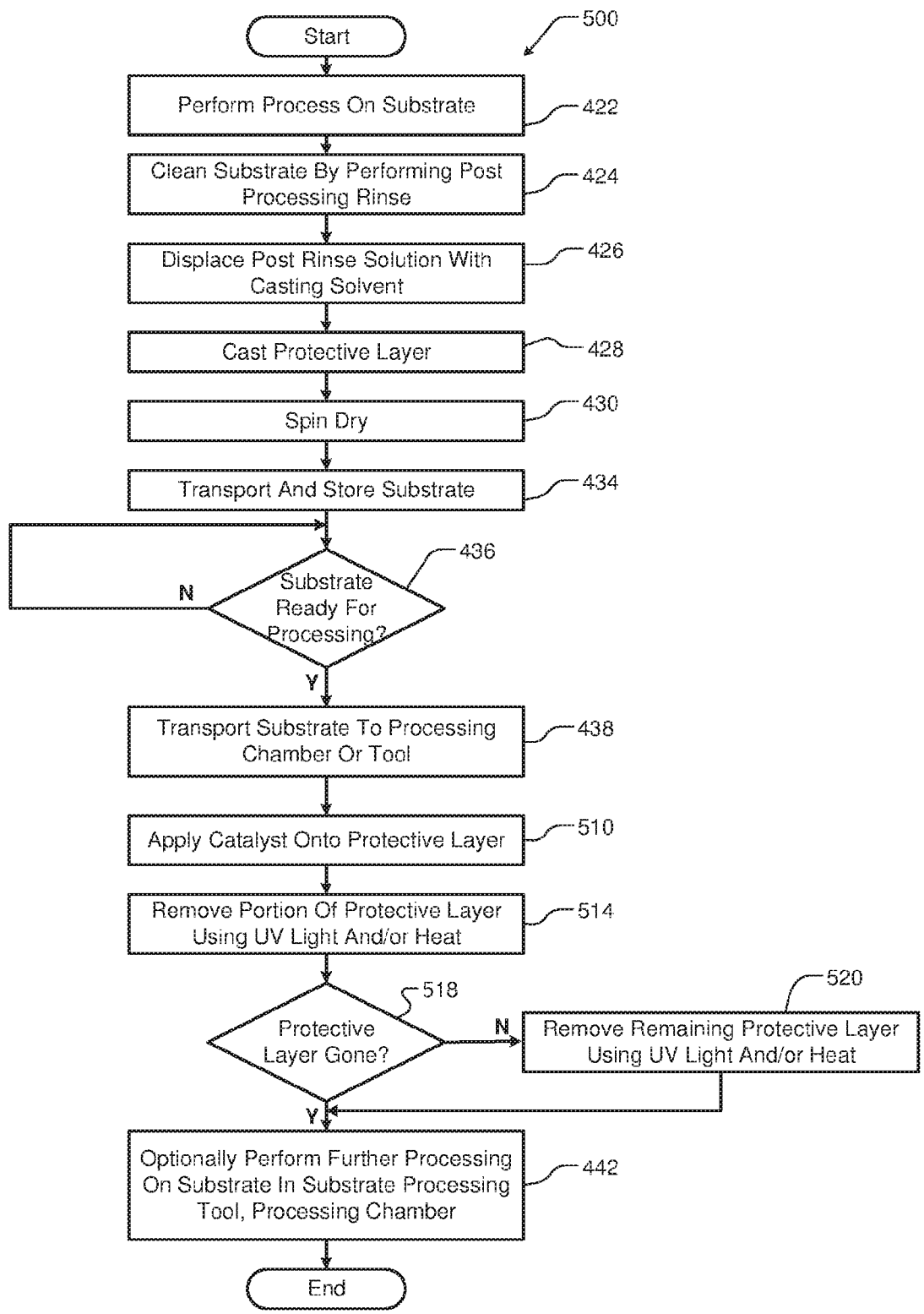
FIG. 5 is a flowchart of an example of a method for adding and removing a sacrificial protective layer from a substrate in steps to prevent collapse using a catalyst according to the present disclosure.

Referring now to FIG. 5, a method 500 for adding the sacrificial protective layer to the substrate and sequentially removing the sacrificial protective layer in steps is shown. At 422, a process is performed on the substrate. In some examples, the process includes deposition, etching, stripping, cleaning, chemical mechanical planarization (CMP), patterning, modification of electrical properties (e.g. doping and optionally annealing or exposure to ultraviolet (UV) light to alter the dielectric constant) or another substrate treatment process. At 424, the substrate is cleaned by performing a post processing rinse.

At 426, the post rinse solution is optionally displaced with a casting solvent. At 428, a solution that will form the sacrificial protective layer is cast, sprayed, applied or deposited on the substrate. At 430, the substrate is optionally rotated or spun to dry the substrate. At 434, the substrate is ready to be transported and/or stored in an ambient environment.

At 436, the method determines whether the substrate is ready for the sacrificial protective layer to be removed (for example prior to further processing). If 436 is true, the substrate is transported to a processing chamber or substrate processing tool at 438 where the sacrificial protective layer is removed. At 510, a solution that will form a catalyst layer is cast, sprayed, applied or deposited to the sacrificial protective layer. At 514, the sacrificial protective layer is partially removed by exposing the substrate to heat or UV light. At 518, the method determines whether the sacrificial protective layer has been fully removed. If not, the method continues at 520 and removes the remaining portion of the sacrificial protective layer using stimuli such as light or heat. In some examples, the heat or light is sufficient to remove the remaining portion of the sacrificial protecting layer in the absence of the catalyst. In other examples, the method returns to step 510 one or more times until the protective layer is gone.

When the thermal catalyst is used, the un-catalyzed co-polymer has a higher degradation temperature than the catalyzed co-polymer. Therefore, partial degradation can be performed to prevent collapse of HAR structures. The temperature of the substrate is increased above the degradation temperature of the catalyzed co-polymer but below the degradation temperature of the un-catalyzed co-polymer. When the PAG catalyst is used, the dye can be used to limit degradation.

Figure 6:
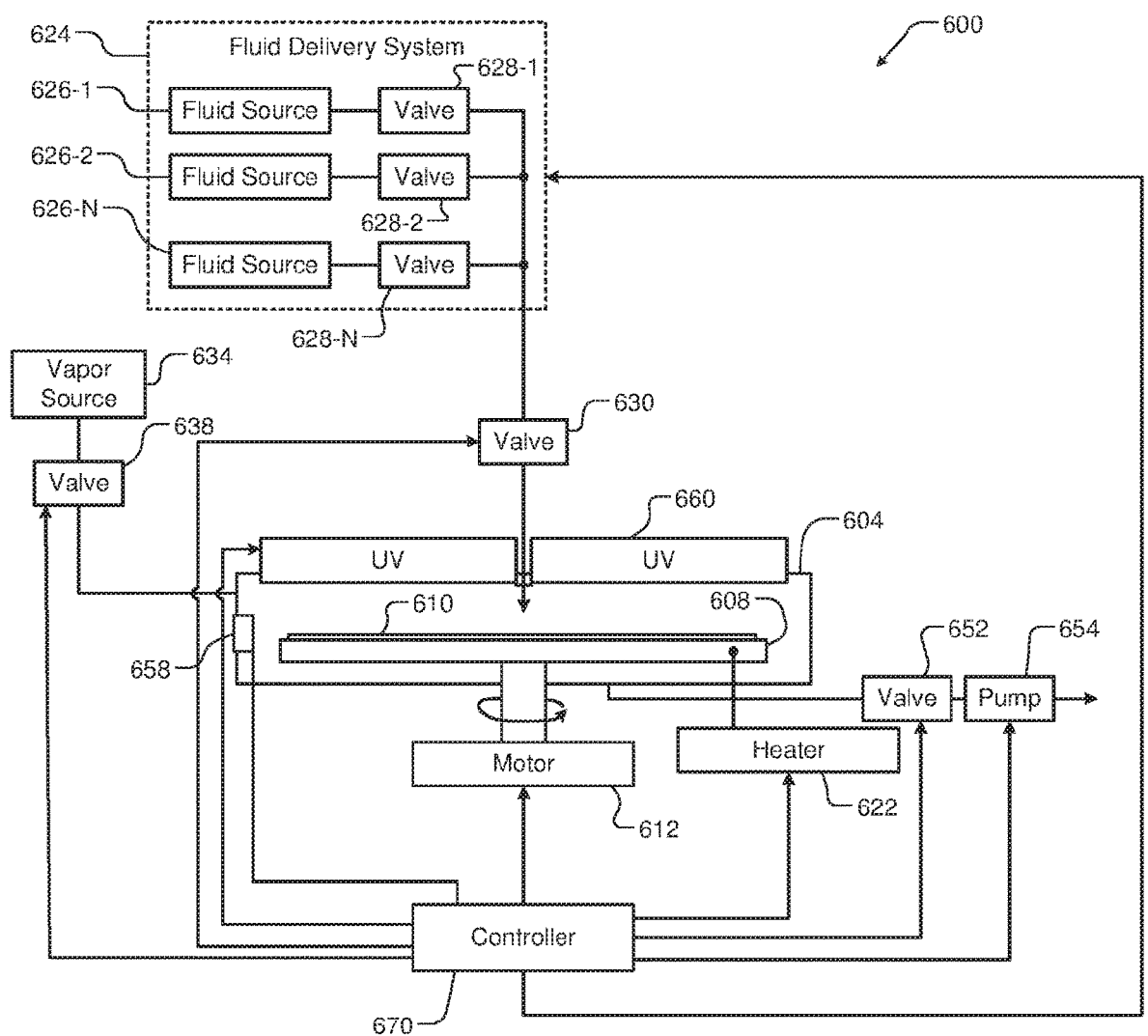
FIG. 6 is a functional block diagram of an example of a substrate processing chamber for adding and removing the sacrificial protective layer according to the present disclosure.

Referring now to FIG. 6, a substrate processing chamber 600 for adding and removing the sacrificial protective layer is shown. A substrate processing chamber 604 includes a substrate support 608 that supports a substrate 610. A heater 622 may be used to heat the substrate support 608. In some examples, the heater 622 includes one or more resistive heaters. In other examples, coolant may be used alone or in combination with the heater 622 to heat and/or cool the substrate support 608. A motor 612 may be used to rotate the substrate support 608.

A fluid delivery system 624 includes one or more fluid sources 626-1, 626-2, . . . , and 626-N (collectively fluid sources 626). The fluid sources 626 may supply liquid such as a solution that will form the sacrificial protective layer, a solution that will form the catalyst and/or other solutions. In some examples, a vapor source 634 including an ampoule or bubbler (not shown) can be used to supply a vapor such as HBr vapor via a valve 638. Outputs of the fluid sources 626 are delivered by valves 628-1, 628-2, . . . , and 628-N (collectively valves 628) and a valve 630 to the processing chamber 604.

A valve 652 and a pump 654 may be used to control pressure in the processing chamber 604 and/or to evacuate reactants from the processing chamber 604 as needed. A pressure sensor 658 may be used to sense pressure within the processing chamber 604.

One or more light sources such as ultraviolet (UV) light sources 660 may be used to expose the substrate during processing. A controller 670 may be used to control the valve 652 and the pump 654, the valve 630, the valve 638, the fluid delivery system 624, the motor 612, and/or other components of the processing chamber 600. In some examples, the controller 670 controls pressure within the processing chamber based on feedback from sensors such as pressure sensors, temperature sensors and the like.

Figure 7:
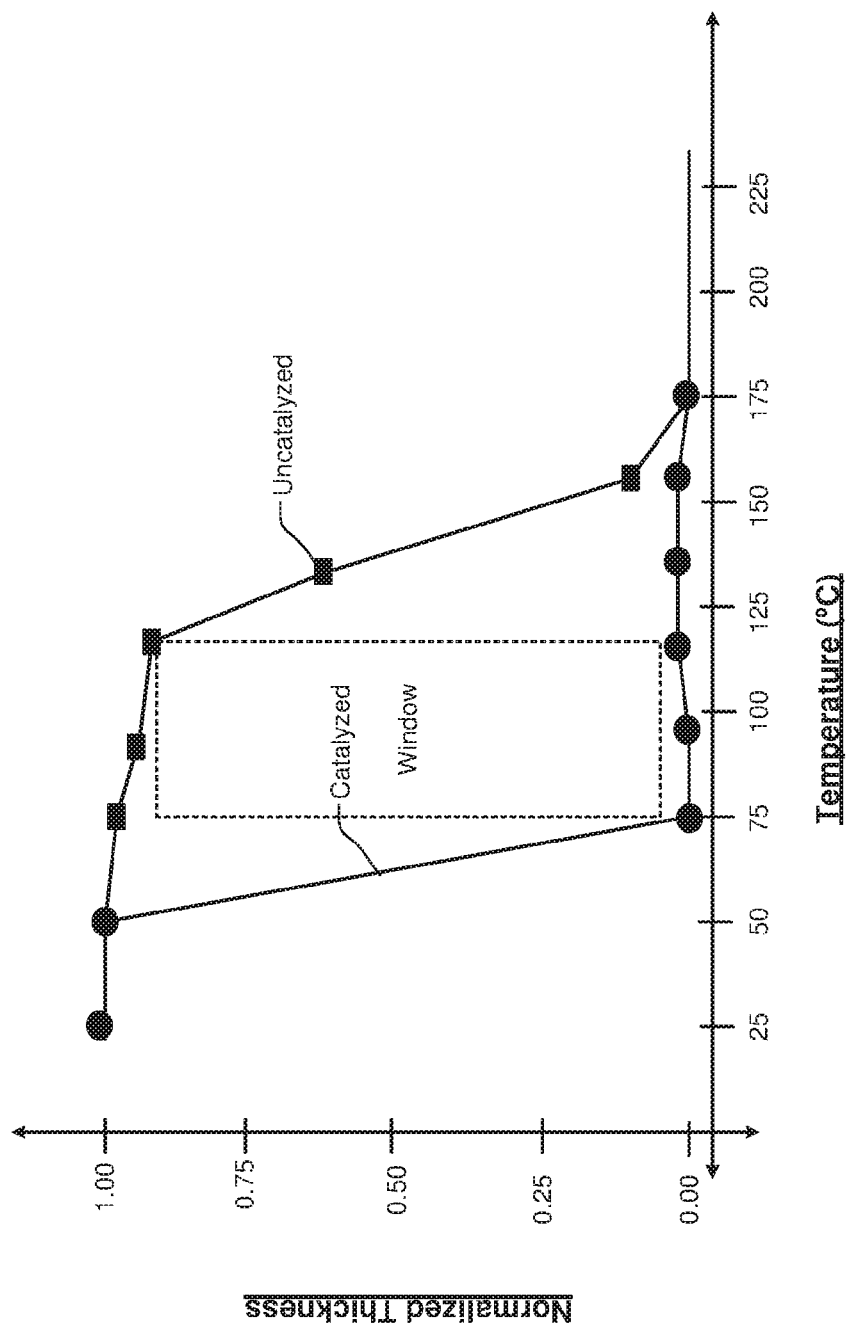
FIG. 7 is a graph illustrating a thermographic analysis of an example of a process window for removing the sacrificial protective layer in steps using a catalyst according to the present disclosure.

Referring now to FIG. 7, a graph illustrates an example of a process window for removing a portion of the sacrificial protective layer using a catalyst. Portions of the sacrificial protective layer that are not catalyzed require a higher degradation temperature as compared to catalyzed portions of the sacrificial protective layer. Therefore, the catalyst layer can be used to incrementally remove portions of the sacrificial protective layer by controlling the temperature in a temperature window below the upper degradation temperature that will de-polymerize the sacrificial protective layer and above a lower degradation temperature that will de-polymerize the catalyzed sacrificial protective layer.

In other words, when the thermal catalyst is used, the un-catalyzed co-polymer has a higher degradation temperature than the catalyzed co-polymer. Therefore, partial degradation can be performed to prevent collapse of HAR structures. The temperature of the substrate is increased above the degradation temperature of the catalyzed co-polymer but below the degradation temperature of the un-catalyzed co-polymer. When the PAG catalyst is used with dye, the degradation using UV light is also limited by the dye.

In some examples, the catalyst is applied a limited number of times (e.g. once or a predetermined number of times) and the substrate is heated to the degradation temperature of the catalyzed co-polymer (once or a predetermined number of times), respectively. If the protective layer remains after a last one of the predetermined number of catalyst applications, the temperature of the substrate can be raised to the degradation temperature of the un-catalyzed co-polymer if needed to remove the remaining portion of the protective layer.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A method comprising:
   a) providing a solution forming a co-polymer having a ceiling temperature;
   b) dispensing the solution onto a surface of a semiconductor substrate to form a sacrificial protective layer, wherein the co-polymer is kinetically trapped to allow storage at a temperature above the ceiling temperature;
   c) exposing the substrate to non-vacuum conditions for storage; and
   d) exposing the sacrificial protective layer to a stimulus to de-polymerize the sacrificial protective layer.

2. The method of claim 1, wherein the co-polymer comprises a poly(aldehyde) co-polymer.

3. The method of claim 1, wherein the ceiling temperature is lower than room temperature.

4. The method of claim 1, further comprising dispensing a casting solvent on the substrate prior to dispensing the solution on the substrate.

5. The method of claim 1, further comprising adding a thermal catalyst to the solution prior to dispensing the solution.

6. The method of claim 5, wherein the thermal catalyst comprises a thermal acid generator or a thermal base generator.

7. The method of claim 1, further comprising adding a photocatalyst to the solution prior to dispensing the solution.

8. The method of claim 7, wherein the photocatalyst comprises a photo acid generator or a photo base generator.

9. The method of claim 7, further comprising adding a dye to the photocatalyst.

10. The method of claim 1, wherein d) includes:
    d1) dispensing a thermal catalyst onto the sacrificial protective layer; and
    d2) heating the substrate to a temperature that is greater than a catalyzed co-polymer degradation temperature and less than an un-catalyzed co-polymer temperature.

11. The method of claim 10, further comprising repeating d1) and d2) one or more times until the sacrificial protective layer is removed.

12. The method of claim 10, further comprising d3) heating the substrate to a temperature that is greater than the un-catalyzed co-polymer temperature to remove remaining portions of the sacrificial protective layer.

13. The method of claim 10, wherein the thermal catalyst comprises a thermal acid generator or a thermal base generator.

14. The method of claim 1, further comprising:
    prior to b), performing a first treatment process on the substrate in a first substrate processing tool;
    performing a) and b) in the first substrate processing tool;
    performing d) in a second substrate processing tool; and
    performing a second treatment process on the substrate in the second substrate processing tool.

15. The method of claim 14, wherein:
    the first treatment process is selected from a group consisting of deposition, etching, stripping, cleaning, chemical mechanical planarization (CMP), patterning, or modification of electrical properties of the substrate; and
    the second treatment process is selected from a group consisting of deposition, etching, stripping, cleaning, chemical mechanical planarization (CMP), patterning, or modification of electrical properties of the substrate.

16. The method of claim 1, wherein the stimulus comprises heat.

17. The method of claim 1, wherein the stimulus comprises UV radiation.

18. The method of claim 1, wherein the stimulus comprises acidic vapor.

19. A method comprising:
    a) providing a semiconductor substrate having sensitive surface; and
    b) dispensing a solution comprising a polymer having a ceiling temperature onto the sensitive surface of the semiconductor substrate to form a sacrificial protective layer, wherein the polymer is kinetically trapped to allow storage at a temperature above the ceiling temperature; and
    c) transporting the semiconductor substrate in non-vacuum conditions for storage.

20. A method comprising:
    receiving from storage a semiconductor substrate having a sensitive surface, the sensitive surface covered by a sacrificial protective layer comprising a polymer having a ceiling temperature, wherein the polymer is kinetically trapped to allow storage at a temperature above a ceiling temperature;
    transporting the semiconductor substrate in non-vacuum conditions for storage; and
    exposing the sacrificial protective layer to a stimulus to de-polymerize and remove the sacrificial protective layer without damaging the sensitive surface.

* * * * *